United States Patent [19]

Dhong et al.

[11] Patent Number: 5,418,477

[45] Date of Patent: May 23, 1995

[54] DATA OUTPUT BUFFER PULL-DOWN CIRCUIT FOR TTL INTERFACE

[75] Inventors: Sang H. Dhong; Hyun J. Shin, both of Mahopac, N.Y.

[73] Assignee: International Business Machines Corporation, Armonk, N.Y.

[21] Appl. No.: 52,005

[22] Filed: Apr. 22, 1993

[51] Int. Cl.6 .......................................... H03R 19/094
[52] U.S. Cl. ...................................... 326/71; 326/81; 326/58
[58] Field of Search ................ 307/443, 451, 473, 475

[56] References Cited

U.S. PATENT DOCUMENTS

| | | | |
|---|---|---|---|
| 4,307,308 | 12/1981 | Sano | 307/475 |
| 4,430,582 | 2/1984 | Bose et al. | 307/475 |
| 5,144,165 | 9/1992 | Dhong et al. | 307/475 |
| 5,206,545 | 4/1993 | Huang | 307/443 |
| 5,274,284 | 12/1993 | Krenik et al. | 307/475 |
| 5,282,176 | 1/1994 | Allen et al. | 307/475 X |

OTHER PUBLICATIONS

R. C. Flaker et al, "Three to Five Volt Off Chip Driver Interface Circuit", Research Disclosure, May 1987, No. 277.

*Primary Examiner*—David R. Hudspeth
*Attorney, Agent, or Firm*—Philip J. Feig; Ronald L. Drumheller

[57] ABSTRACT

A pull-down circuit for a TTL compatible data output buffer uses NMOS devices. The pull-down circuit comprising two NMOS stages. Namely, a diode configuration stage where the gate and drain electrodes are shorted together during pull-down and a common-source stage. Both PMOS and NMOS devices are used for shorting the gate and drain electrodes.

22 Claims, 7 Drawing Sheets

DATA OUTPUT BUFFER PULL-DOWN CIRCUIT FOR TTL INTERFACE

BACKGROUND OF THE INVENTION

The present invention relates to a pull-down circuit for a TTL compatible data output buffer using NMOS devices. Specifically, the circuit results in improvement of the under-shoot and over-shoot of the output node during load pull-down and in reduction of the bouncing of the on-chip ground node making the circuit particularly suitable for interfacing between 3 volt and 5 volt off-chip bus systems.

As CMOS technology improves, the need for interfacing between 3 volt and 5 volt systems increases. An off-chip driver (OCD) which provides the interface between a 3 volt chip and a 5 volt off-chip bus is a challenge to design because an on-chip pull-down circuit operating at 3 volts (2.8 volt in a worst case) must be able to discharge into a capacitive load charged to 5.6 volts to ground potential. When contrasted with a 5 volt chip discharging a 5 volt off-chip bus, the pull-down device on a 3 volt chip has to be able to operate with a minimum power supply voltage of 2.8 volts, which reduces the over-drive of the pull-down device. Consequently, the pull-down device for a 3 volt chip is larger than its 5 volt counterpart and more prone to under-shooting and over-shooting as well as larger ground bounce.

U.S. Pat. No. 5,144,165 entitled "CMOS Off-Chip Driver Circuits", assigned to the same assignee as the present invention, discloses a CMOS off-chip driver circuit which interfaces between 3 volts and 5 volts but the pull-down circuit is a common-source single stage NMOS circuit. The present invention concerns a different NMOS pull-down circuit which overcomes some of the limitations associated with common-source NMOS pull-down circuits as will be described below.

U.S. Pat. No. 4,430,582 entitled "Fast CMOS Buffer for TTL Input Levels" discloses a CMOS buffer (or voltage regulator) which controls the power supply voltage to the CMOS gates so that the CMOS gates maintain compatibility with the TTL interface levels with power supply and process variations.

U.S. Pat. No. 4,307,308 entitled "Digital Signal Conversion Circuit" discloses a level shifter which converts the TTL voltage levels to the operating range of the MOS logic circuits so that the two different circuits are able to communicate with one another.

Research Disclosure No. 27711, dated May, 1987, entitled "Three to Five Volt Off Chip Driver Interface Circuit" discloses an off-chip driver whose pull-down circuit comprises a common-source NMOS circuit in series with a zero-volt NMOS device. This circuit requires a zero-volt NMOS device for proper operation which is a drawback for most CMOS technologies since zero-volt NMOS devices are no longer used in such technologies.

SUMMARY OF THE INVENTION

The present invention relates to a TTL-compatible pull-down circuit with reduced under-shoot and reduced over-shoot compared with prior art circuits. The pull-down circuit basically comprises two NMOS devices. The first device is configured in the so-called diode configuration where the gate and drain electrodes are shorted together during pull-down. The second device is a common-source configuration of the type disclosed in the prior art. The combination of the two devices results in a circuit which is fully TTL compatible and exhibits improved transient performance over the known circuits. The pull-down circuit provides all interface with an external bus having a higher voltage than the on-chip power supply.

Another important aspect of the invention is the use of both PMOS and NMOS devices for shorting the gate and the drain of the pull-down device. Consequently, if a capacitive load is charged to a voltage higher than the on-chip power supply voltage $V_{DD}$, then the pull-down device in the diode configuration has a higher-than-$V_{DD}$ voltage on its gate and hence, a larger overdrive voltage than would have conventionally been available on the chip. As a result, an excellent pull-down characteristic is achieved when the capacitive load is charged to the higher voltage.

A further important aspect of the invention is the capability of the PMOS device used to short the gate and drain of the pull-down device to be a tri-state or high impedance device. A level shifting circuit is used to create a tri-state for the PMOS device when the load is higher than $V_{DD}$.

A principal object of the present invention is therefore, the provision of a pull-down circuit for TTL compatible data output buffer using NMOS devices comprising two stages where the first stage is a conventional NMOS device operation in the grounded source mode and the second stage which employs PMOS and NMOS circuits for shorting the gate and source of the NMOS device during pull-down.

Another object of the present invention is the provision of a pull down circuit using two NMOS transistors with one transistor in the diode configuration and using both PMOS and NMOS devices to short the gate and drain of the pull down device whereby the pull down circuit is useful for interfacing 3 volt power supply chips with 5 volt power supply chips.

A further aspect of the invention is the provision of a PMOS device in a pull-down circuit with a controller which places the second stage NMOS device in a high impedance or tri-state even when the output device is connected to an external node which can be higher than the on-chip power supply voltage.

A still further object of the invention is the provision of a controller for providing a n-well voltage for the PMOS device so that the source and drain of the PMOS device is not forward biased for an external voltage higher than the on-chip power supply voltage.

A still further object of the invention is the provision of delaying of the turn-on of the NMOS device used for shorting the source and drain of the two stage device in order to reduce electrical degradation of the NMOS device.

Further and still other objects of the present invention will become more clearly apparent when the following description is read in conjunction with the accompanying drawing.

DETAILED DESCRIPTION

Figure 1:
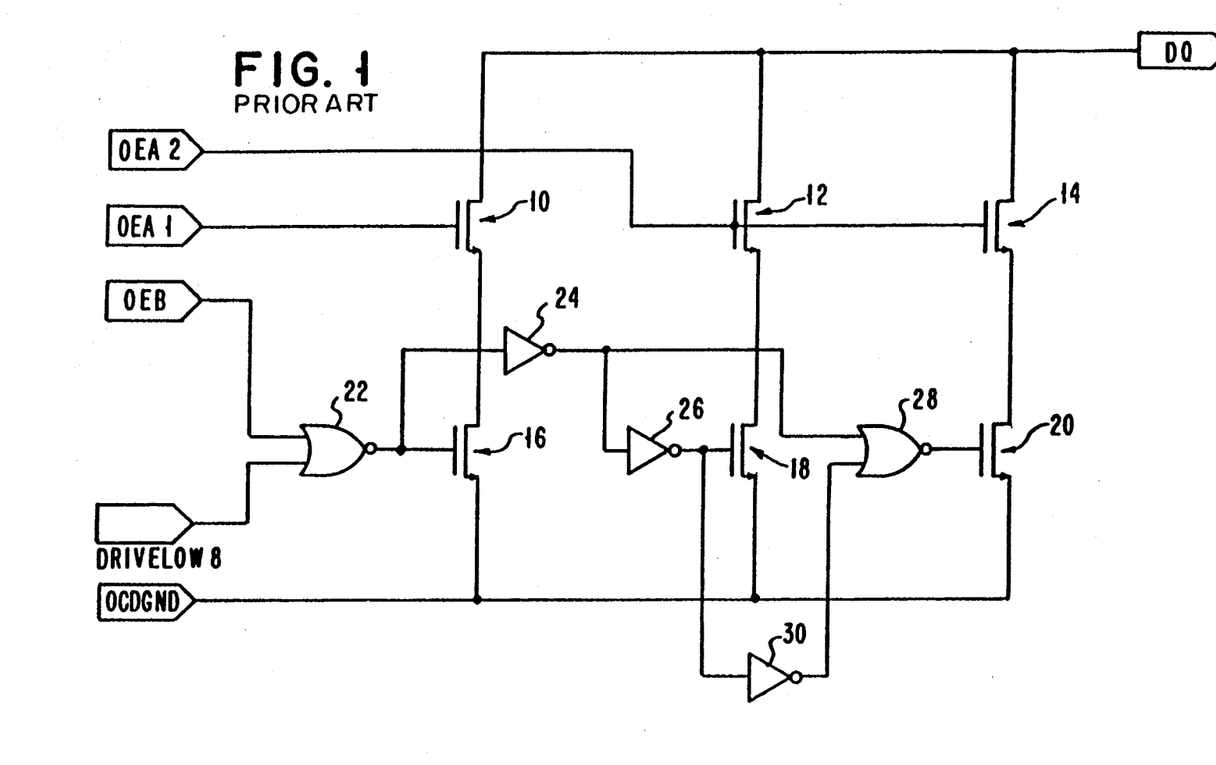
FIG. 1 is a schematic representation of a prior art TTL compatible NMOS three stage pull-down circuit with control signals.

Referring now to the figures and to FIG. 1 in particular, there is shown a schematic representation of a prior art TTL compatible NMOS three stage pull-down circuit.

The drains of transistors 10, 12 and 14 are connected together and to output DQ. The source of transistor 10 is connected to the drain of transistor 16, the source of transistor 12 is connected to the drain of transistor 18 and the source of transistor 14 is connected to the drain of transistor 20. The sources of transistor 16, 18 and 20 are connected to ground potential.

In operation, NMOS transistor 10, NMOS transistor 12 and NMOS transistor 14 are activated when high logic level signals are manifest at OEA1 and OEA2 inputs. When low logic level signals are manifest at both inputs DRIVELOWB and OEB, NMOS transistor 16, NMOS transistor 18 and NMOS transistor 20 are activated in sequence. Ground potential is provided at OCDGND.

In operation the inputs DRIVELOWB and OEB are provided as inputs to NOR gate 22. The output of NOR gate 22 is provided to the gate of transistor 16 and as the input of inverter 24. The output of inverter 24 is provided to the input of a second inverter 26 and as one input to NOR gate 28. The output of inverter 26 is provided to the gate of transistor 18 and as the input to a third inverter 30. The output of inverter 30 is provided to the other input of inverter 28. The output of inverter 28 is provided to the gate of transistor 20.

The time delay between activation of transistor 16 and transistor 18 is determined by inverter 24 and inverter 26. The time delay between activation of transistor 18 and transistor 20 is determined by inverter 30 and NOR gate 28.

The device sizes are optimized for discharging a 100 pF capacitive load initially charged to 5.6 volts to ground potential in 10 ns at 100° C. with a nominal CMOS process. Since in the worst case the on-chip power supply is low as 2.8 volts, then pull-down device sizes are larger than what is required for use with a 5 volt power supply. As a result, the circuit has an oscillating tendency when the load is less than 100 pF, for example, 50 pF, or when the power supply is higher and shorter channel length devices are employed.

Figure 2A:
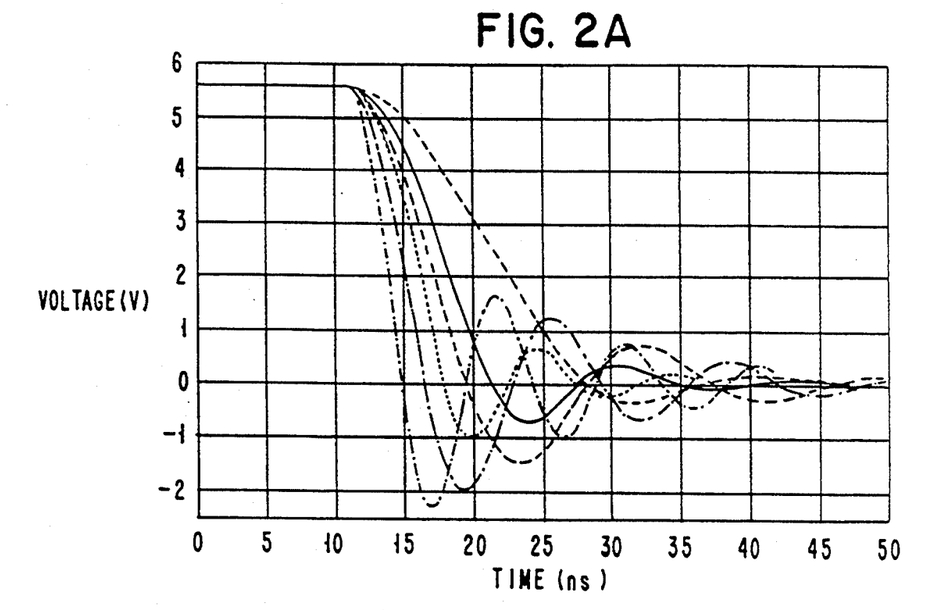
FIG. 2a is a graphical representation of the pull-down voltage waveforms when using the prior art circuit in FIG. 1.

FIG. 2a graphically illustrates the voltage waveform at output DQ for different capacitive loads of 50 pF, 100 pF and 200 pF.

Figure 2B:
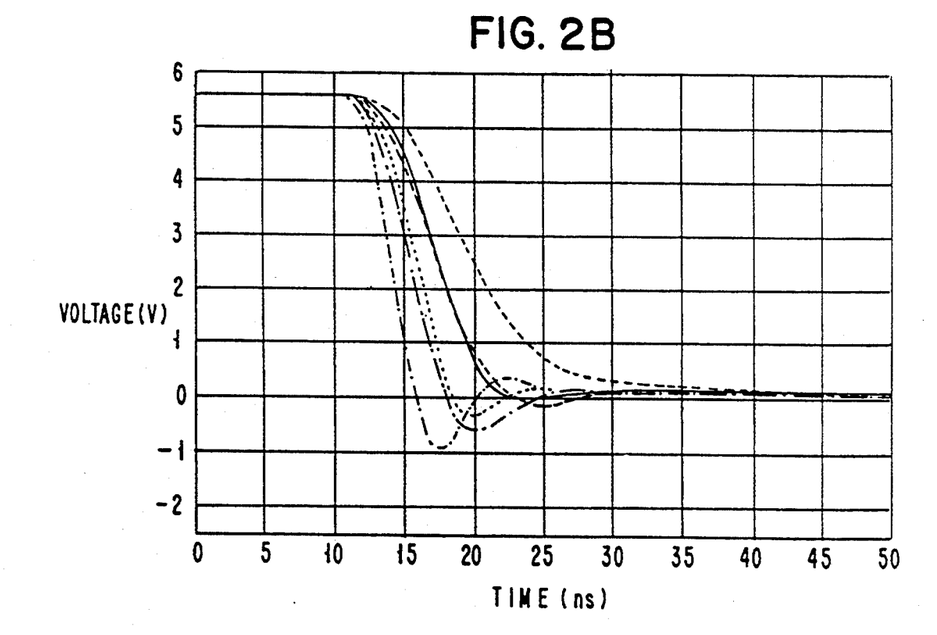
FIG. 2b is a graphical representation of the pull-down voltage waveforms when using the present invention.
Figure 3:
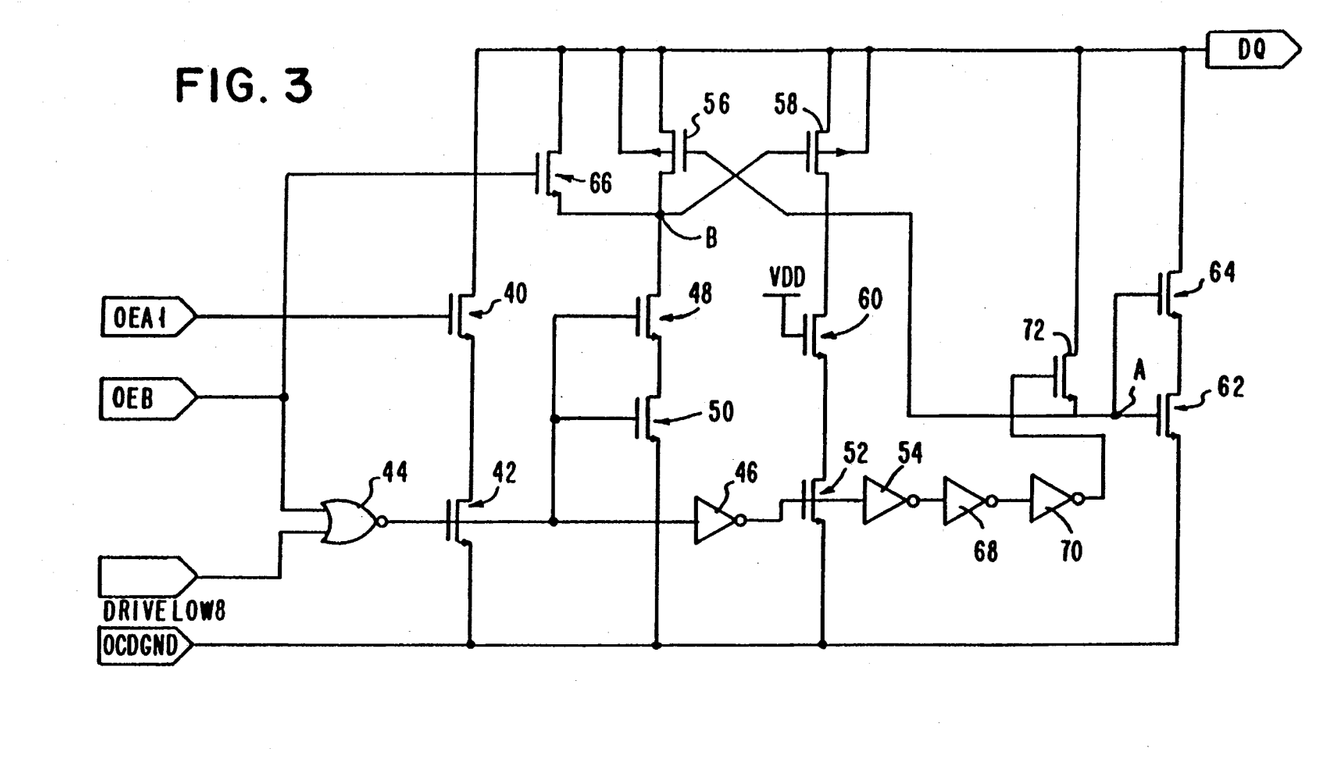
FIG. 3 is a graphical representation of a preferred embodiment of the present invention with stacked devices.
Figure 4:
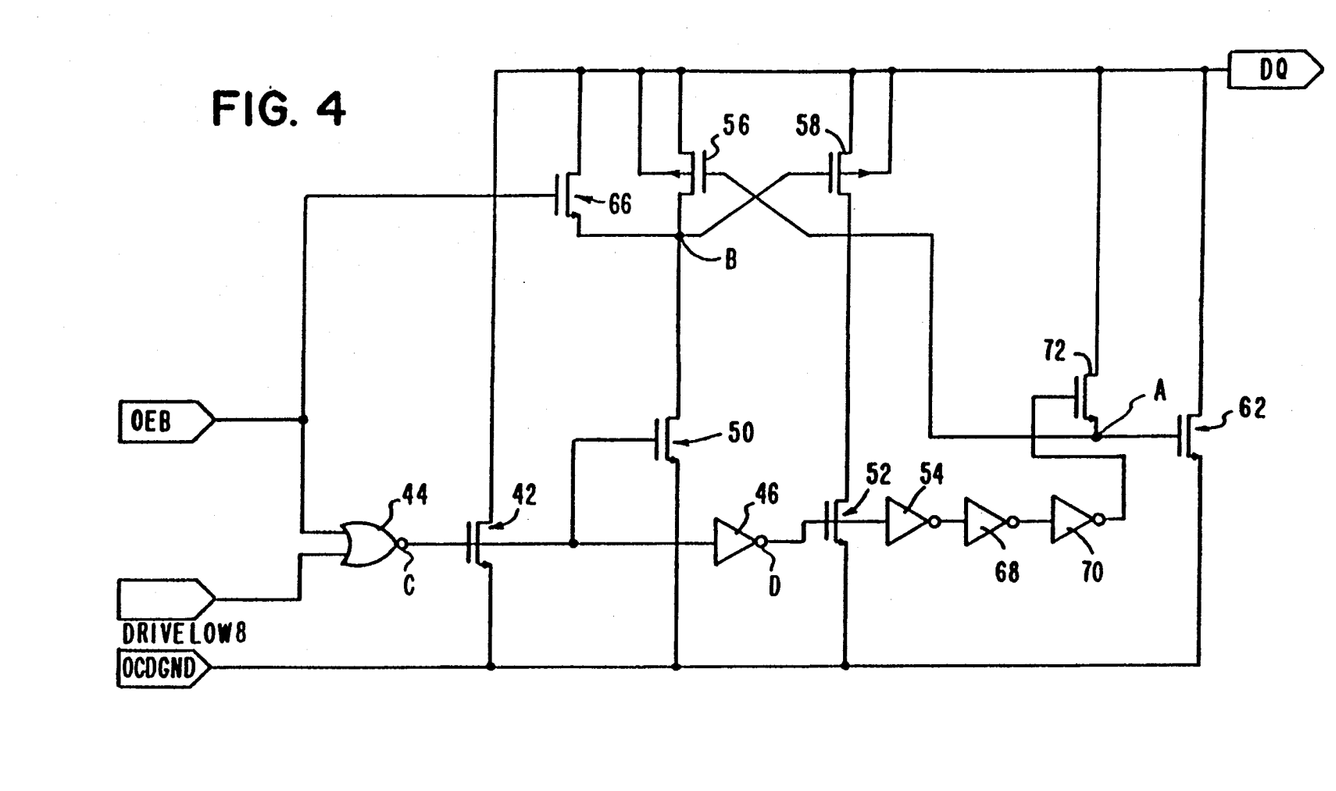
FIG. 4 is a graphical representation of a preferred embodiment of the present invention without stacked devices.

In accordance with the teachings of the present invention, TTL-compatible pull-down circuits as shown in FIG. 3 and in FIG. 4 are provided with reduced undershoot and overshoot as shown in FIG. 2b. FIG. 2b is a graphical representation of the output of the pull-down node DQ with the same loading as that used in conjunction with the curves shown in FIG. 2a. However, it is evident from the graphical representations that improved signals are achieved when practicing the present invention.

The circuits shown in FIG. 3 and FIG. 4 comprise the preferred embodiments of the present invention. The difference between the two circuits resides in whether the NMOS devices are stacked, as shown for example in FIG. 3 with NMOS transistor 40 and NMOS transistor 42 or whether a single NMOS transistor 42 is used as shown in FIG. 4. The decision whether to employ stacked transistors (FIG. 3) or single transistors (FIG. 4) is dependent upon the application as well as the specific technology used to implement the circuit. In both FIG. 3 and FIG. 4 the node DQ is the output of the respective circuits and is connected to an external load.

Figure 5A:
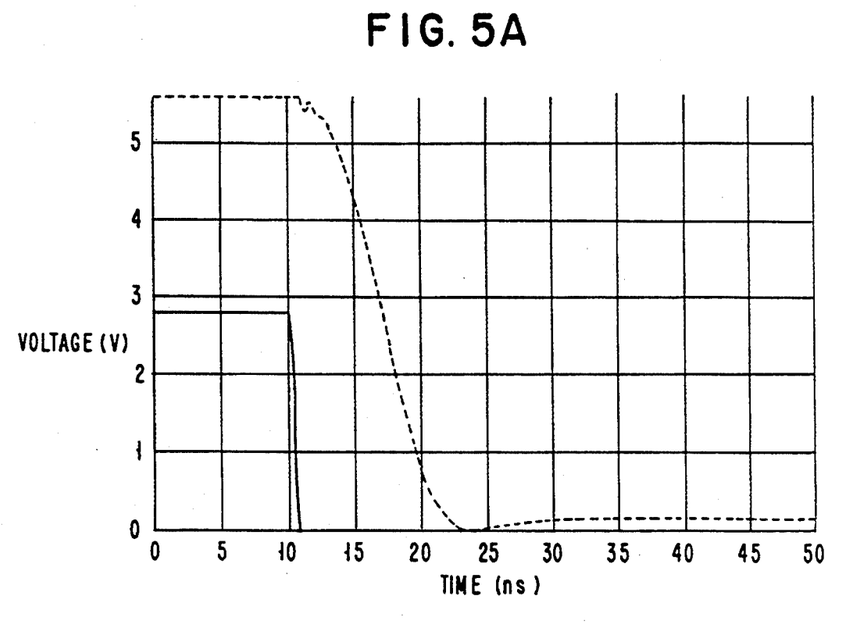
FIGS. 5a and 5b are graphical representations of waveforms of voltages at internal nodes of the circuit.
Figure 5B:
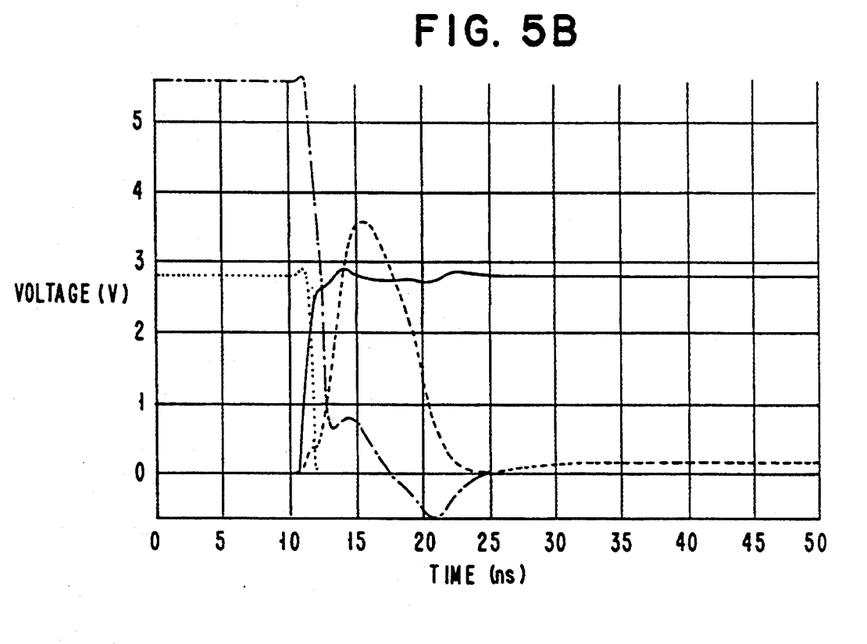

The circuit operation can best be understood with reference to the schematic diagram shown in FIG. 3. FIGS. 5a and 5b are graphical representation of computer simulated internal node voltage waveforms at the nodes indicated in the legends.

During the standby (or in high-Z state), the signals at node OEB and DRIVELOWB are both at high levels and the signal at node OEA1 is at a low logic level.

The signals at OEB and DRIVELOWB are both provided as inputs to NOR gate 44. The output of NOR gate 44, which is at a low level, is connected to the gates of NMOS transistor 42, NMOS transistor 48, NMOS transistor 50 and to the input of inverter 46. Inverter 46 inverts the input signal and provides its output signal to the gate of NMOS transistor 52 and to the input of inverter 54. With the output of NOR gate 44 in a low state and the output of inverter 46 at a high state, the level shifter comprising PMOS device 56, PMOS device 58, NMOS transistor 48, NMOS transistor 50, NMOS transistor 52 and NMOS transistor 60 maintain the signal at the gate of NMOS transistor 62 at a low level, turning transistor 62 and NMOS transistor 64 both off. At the same time, PMOS device 56 is on which, in turn, maintains the gate of PMOS device 58 at the same voltage as output node DQ. Since PMOS device 58 is off, the signal at the gates of NMOS transistor 62, 64 is isolated from the output node DQ. Thus, the signal at the gates of transistors 62, 64 can be maintained at a low level by virtue of NMOS transistor 52, 60 being on while maintaining the high-Z state. Also, NMOS transistor 48 and NMOS transistor 50 are off and PMOS device 56 and NMOS transistor 66 are oil. Thus, the node B is electrically connected only to the node DQ and is properly tri-stated.

During pull-down the signal at node OEA1 goes to a high logic level state, turning NMOS transistor 40 on. As both the signals at node OEB and DRIVELOWB change to the low level, the output of NOR gate 44 rises to VDD and the output of inverter 46 falls to ground potential. As the output of NOR gate 44 rises, NMOS transistor 42 turns on which begins to discharge node DQ toward ground level. PMOS device 56 changes its state from on to off while PMOS device 58 changes its state from off to on. When PMOS device 58 is on, the gate of NMOS transistor 64 (node A) and its drain (which is connected node DQ,) are shorted together in a diode configuration. Thus, the node DQ is discharged through NMOS transistor 62 and NMOS transistor 64.

The output of inverter 46 further propagates through the series connected inverters 54, 68 and 70. Because there is an odd number of such serially connected inverters, the signal at the output of inverter 70 is in a high level state and NMOS transistor 72 is turned on. When both NMOS transistor 62 and NMOS transistor 72 are on, the gate and drain of the NMOS transistor 64 remain shorted together, even though the node DQ reaches ground potential. Moreover, by delaying the turning on of NMOS transistor 72, via the effect of the serially connected inverters connected to the gate of NMOS transistor 72, the potential hot-electron effect on NMOS transistor 72 is reduced because the charging of node A to the same voltage as the voltage at the node DQ is mostly accomplished by PMOS device 58.

FIG. 4 is a schematic representation of a preferred embodiment of the present invention without the inclusion of stacked devices. The same elements common to FIG. 3 and FIG. 4 have the same reference numerals.

Operation of the circuit in FIG. 4 is substantially the same as that of the circuit in FIG. 3 except that with the absence of node OEA1 for changing the condition of NMOS transistor 40, the change in level of the signal at node OEB will activate pull-down. When common-source NMOS transistor 72 is turned on, the gate and drain of NMOS transistor 62 are shorted together in a diode configuration. Thus, the node DQ is discharged through NMOS transistor 62.

FIG. 5a and FIG. 5b are graphical representations of internal node voltage waveforms. It will be noted that the maximum voltage at node A (FIG. 5b) is greater than 2.8 volts, which is the value of VDD used in the simulation. This results in the good high voltage characteristics of the pull-down circuit.

Figure 6A:
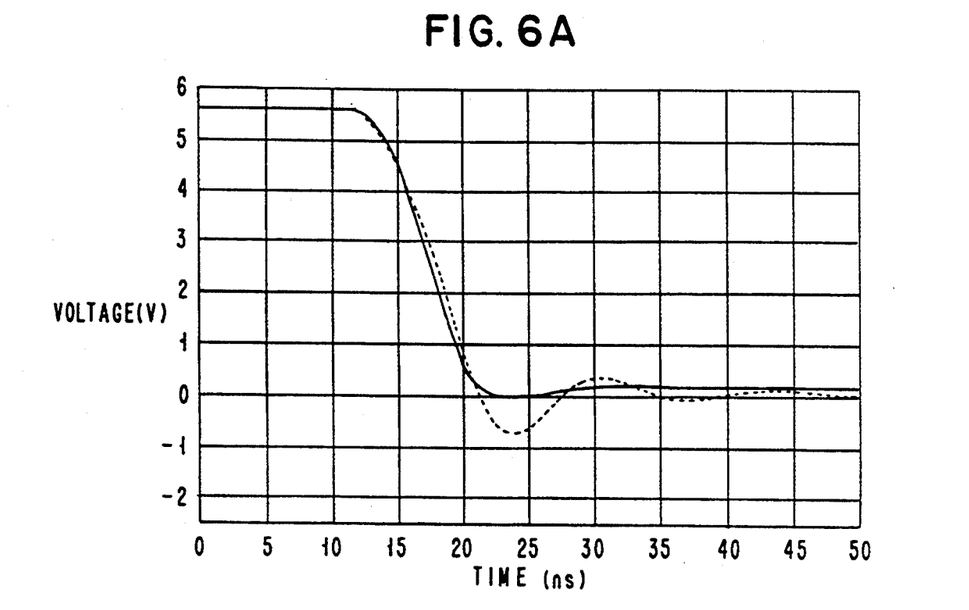
FIGS. 6a and 6b are graphical representation of simulations of the pull-down voltage waveforms with different capacitive loads.
Figure 6B:
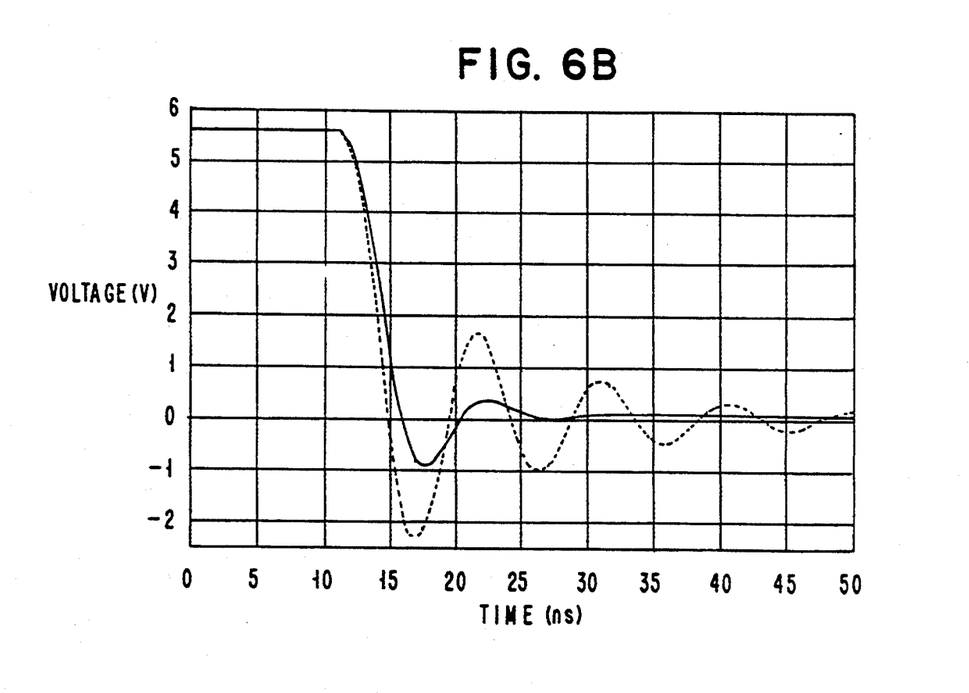

As a comparison, FIGS. 6a and 6b are graphical representations of the output node waveforms of the present invention where the dotted lines are with the best operating condition load and the solid lines are with the worst operating condition load. The best case was simulated with a 50 pF capacitive load at 22° C. The worst case was simulated with a 100 pF capacitive load at 100° C.

The prior art circuit has a tendency to oscillate if the load is small. The transition time is defined as the time between the activation of the pull-down circuit and the time that the output node reaches a voltage of less than 0.4 volts. The following table summarizes the improvement in transition time achieved with the present invention.

| Circuit | 50 pF(*) | 100 pF(*) | 200 pF(*) | 50 pF() | 100 pF() | 200 pF(**) |
| --- | --- | --- | --- | --- | --- | --- |
| FIG. 1 | 160.8 ns | 10.68 ns | 16.7 ns | 22.63 ns | 29.32 ns | 2.1 ns |
| FIG. 3 | 7.87 ns | 10.6 ns | 18.5 ns | 5.5 ns | 7.5 ns | 1.9 ns |

Figure 7A:
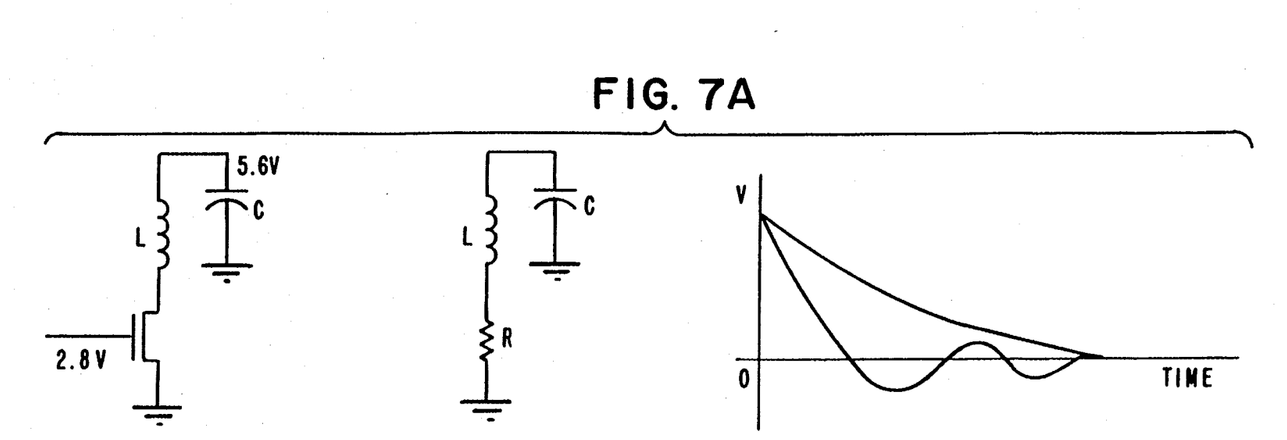
FIG. 7a is a schematic representation of a simplified equivalent circuit of the DOB pull-down circuit shown in FIG. 1.
Figure 7B:
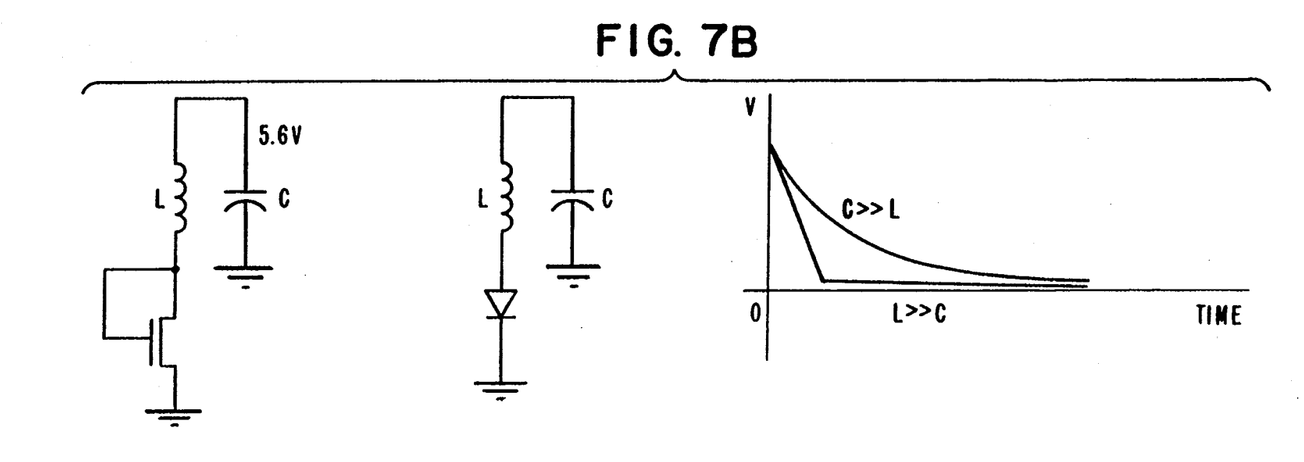
FIG. 7b is a schematic representation of a simplified equivalent circuit of the DOB pull-down circuit shown in FIG. 3.

(*) means 100° C., 2.8 V VDD, nominal process
(**) means 22° C., 3.7 V VDD, best process The reason for the improvement as understood by the inventors is best described in conjunction with FIG. 7a and FIG. 7b. A common-source NMOS transistor pulling a capacitive load through all inductive package lead can be simulated by a R-L-C series circuits as shown in FIG. 7a. Depending upon the values of R,L,C, where R is the transconductance of the transistor, the circuit will oscillate. Therefore, as the process and the operating voltage change, the transconductance of the NMOS transistor, which is shown schematically as resistor R, changes and the circuit will often show an oscillatory tendency as shown in the graph.

If the load is discharged by an NMOS transistor in the diode configuration, the NMOS transistor is always operating in a saturation region. Even though its waveform is still a function of L, C and the transconductance of the NMOS transistor, the waveform lies between the two extreme cases of L>>C and C>>L as shown in FIG. 7b and does not exhibit any oscillatory tendency.

In its preferred implementation, the present invention comprises two stages. A common-source NMOS transistor stage and a NMOS transistor stage in the diode configuration for TTL compatibility. Therefore, the circuit because of the common-source NMOS transistor stage will still have a tendency to oscillate in extreme operating conditions but to a much lesser extent than the prior-art circuit.

While the preferred embodiment of the present invention comprises two stages, it will be apparent to those skilled in the art that the invention is capable of being implemented using three or four or more stages, instead of the two stage embodiment described and illustrated.

While there has been described and illustrated a data output buffer pull down circuit for TTL interface and a modification thereof, it will be apparent to those skilled in the art that further modification and variations are possible without deviating from the broad teachings and spirit of the present invention which shall be limited solely by the scope of the claims appended hereto.

What is claimed is:

1. A pull-down circuit for providing a data interface with an external bus having a higher digital-high bus voltage than any supply voltage of the pull-down circuit, the pull-down circuit bringing a digital-high bus voltage on the external bus to a digital-low bus voltage in response to an input digital-low data signal, comprising:

a first NMOS device for channeling current from the external bus to a digital-low bus voltage source during pull-down, said first NMOS device having a gate;

a voltage level shifting circuit responsive to an input digital-low data signal for effectively connecting the gate of the first NMOS device to the external bus to place the first NMOS device into diode configuration to pull down the voltage of the external bus;

a delay circuit for delaying the input digital-low data signal for a predetermined delay period; and a second NMOS device operating in a common source configuration and responsive to the delayed input digital-low signal for maintaining effective electrical connection of the gate of the first NMOS device to the external bus to maintain the first NMOS device in diode configuration as the voltage of the external bus is pulled all the way down to the voltage of the digital-low bus voltage source.

2. A pull-down circuit as set forth in claim 1 wherein said first NMOS device comprises two NMOS transistors connected in series between the external bus and the digital-low bus voltage source; each of said two NMOS transistors having a gate, and each of said gates being effectively connected by said voltage level shifting circuit to the external bus in response to an input digital-low data signal.

3. A pull-down circuit as set forth in claim 1 wherein said voltage level shifting circuit comprises two PMOS transistors.

4. A pull-down circuit as set forth in claim 3 wherein said PMOS transistors effectively connect the gate of said first NMOS device to said external bus in response to an input digital-low data signal.

5. A pull-down circuit as set forth in claim 3 wherein said PMOS transistors operate in a tri-state.

6. A pull-down circuit as defined in claim 1 wherein said digital-low bus voltage source is ground.

7. A pull-down circuit as defined in claim 1 wherein said predetermined delay period is sufficient to substantially avoid hot-electron effect on the second NMOS device.

8. A pull-down circuit as defined in claim 1 wherein said delay circuit is a series of inverters.

9. A pull-down circuit as defined in claim 1 wherein said first NMOS device comprises an NMOS transistor having a drain-source path and said drain-source path is connected in a current path between the external bus and the digital-low bus voltage source.

10. A pull-down circuit as set forth in claim 9 wherein said NMOS transistor has a gate and said gate is effectively connected by said voltage level shifting circuit to the external bus in response to an input digital-low data signal.

11. A pull-down circuit as set forth in claim 9 wherein said voltage level shifting circuit comprises two PMOS transistors.

12. A pull-down circuit as set forth in claim 11 wherein said PMOS transistors effectively connect the gate of said first NMOS device to said external bus in response to an input digital-low data signal.

13. A pull-down circuit as defined in claim 9 wherein said first NMOS device comprises two NMOS transistors each having a drain-source path and said drain-source paths are connected in series with each other in a current path between the external bus and the digital-low bus voltage source.

14. A pull-down circuit for providing an interface with an external bus having a higher voltage than an on-chip supply voltage comprising:
a first NMOS device operating in a diode configuration during pull-down,
a second NMOS device operating in a common source configuration for discharging a load, and
delay means for delaying operating of said first NMOS device until after activating said second NMOS device.

15. A pull-down circuit for providing a data interface with an external bus having a higher digital-high bus voltage than any supply voltage of the pull-down circuit, the pull-down circuit bringing a digital-high bus voltage on the external bus to a digital-low bus voltage in response to an input digital-low data signal, comprising:
a first NMOS device for channeling current from the external bus to a digital-low bus voltage source during pull-down, said first NMOS device having a gate at a potential;
a voltage level shifting circuit responsive to an input digital-low data signal for raising the potential of the gate of the first NMOS device to place the first NMOS device into diode configuration to pull down the voltage of the external bus;
a delay circuit for delaying the input digital-low data signal for a predetermined delay period; and
a second NMOS device responsive to the delayed input digital-low signal for maintaining the potential of the gate of the first NMOS device at a sufficiently high level to maintain the first NMOS device in diode configuration as the voltage of the external bus is pulled by the first NMOS device all the way down to the voltage of the digital-low bus voltage source.

16. A pull-down circuit as defined in claim 15 wherein said second NMOS device has a gate and a drain-source path and the drain-source path of said second NMOS device connects the external bus to the gate of the first NMOS device, the gate of the second NMOS device receiving the delayed input digital-low data signal.

17. A pull-down circuit as defined in claim 15 wherein said second NMOS device includes an NMOS transistor connected in common source configuration.

18. A pull-down circuit as defined in claim 15 wherein said voltage level shifting circuit includes a PMOS transistor having a source-drain path connecting the external bus to the gate of the first NMOS device and said voltage level shifting circuit raises the potential of the gate of the first NMOS device by biasing said PMOS transistor into an ON state.

19. A pull-down circuit as defined in claim 15 wherein said predetermined delay period is sufficient to substantially avoid hot-electron effect on the second NMOS device.

20. A pull-down circuit as defined in claim 15 wherein said delay circuit is a series of inverters.

21. A pull-down circuit as defined in claim 15 wherein said first NMOS device comprises an NMOS transistor having a drain-source path and said drain-source path is connected in a current path between the external bus and the digital-low bus voltage source.

22. A pull-down circuit as defined in claim 21 wherein said first NMOS device comprises two NMOS transistors each having a drain-source path and said drain-source paths are connected in series with each other in a current path between the external bus and the digital-low bus voltage source.

* * * * *